United States Patent [19]
Moe

[11] 3,906,258
[45] Sept. 16, 1975

[54] FAILURE DETECTING AND INHIBITING CIRCUIT

[75] Inventor: Douglas Ashworth Moe, Martinsville, N.J.

[73] Assignee: RCA Corporation, New York, N.Y.

[22] Filed: Mar. 4, 1974

[21] Appl. No.: 447,935

[52] U.S. Cl. ............. 307/232; 307/234; 307/247 R; 307/215; 307/216; 317/33 R; 328/92
[51] Int. Cl.² H03D 13/00; H03K 5/20; H03K 19/20
[58] Field of Search ....... 307/232, 234, 236, 247 A, 307/247 R, 215, 216, 218; 317/33 R; 328/91–94, 111, 112

[56] References Cited

UNITED STATES PATENTS

| | | | |
|---|---|---|---|
| 3,586,878 | 6/1971 | Maxham | 307/234 |
| 3,659,214 | 4/1972 | Iijima | 307/247 R |
| 3,796,831 | 3/1974 | Bauer | 307/234 |

OTHER PUBLICATIONS

"CKT to Eliminate Contact Bounce and Reject Noise," by Getzlaff et al., in IBM Tech. Discl. Bull., Vol. 12, No. 6, November, 1969, pp. 858–859.

*Primary Examiner*—Stanley D. Miller, Jr.
*Attorney, Agent, or Firm*—H. Christoffersen; S. Cohen

[57] ABSTRACT

A logic equivalence gate compares signals supplied to and received from an electronic switching circuit to produce an output signal when the switching circuit fails to perform a specified switching operation. A pulse width discriminator rejects noise normally present in the output signal caused by the inherent delay of the switching circuit in normal operation. The noise free output of the pulse width discriminator is applied to a flip flop to provide a stored indication of failure of the switching circuit. The stored signal is also applied to an inhibit gate connected to the input of the switching circuit for preventing further application of input signals to the switching circuit after failure has been detected.

6 Claims, 1 Drawing Figure

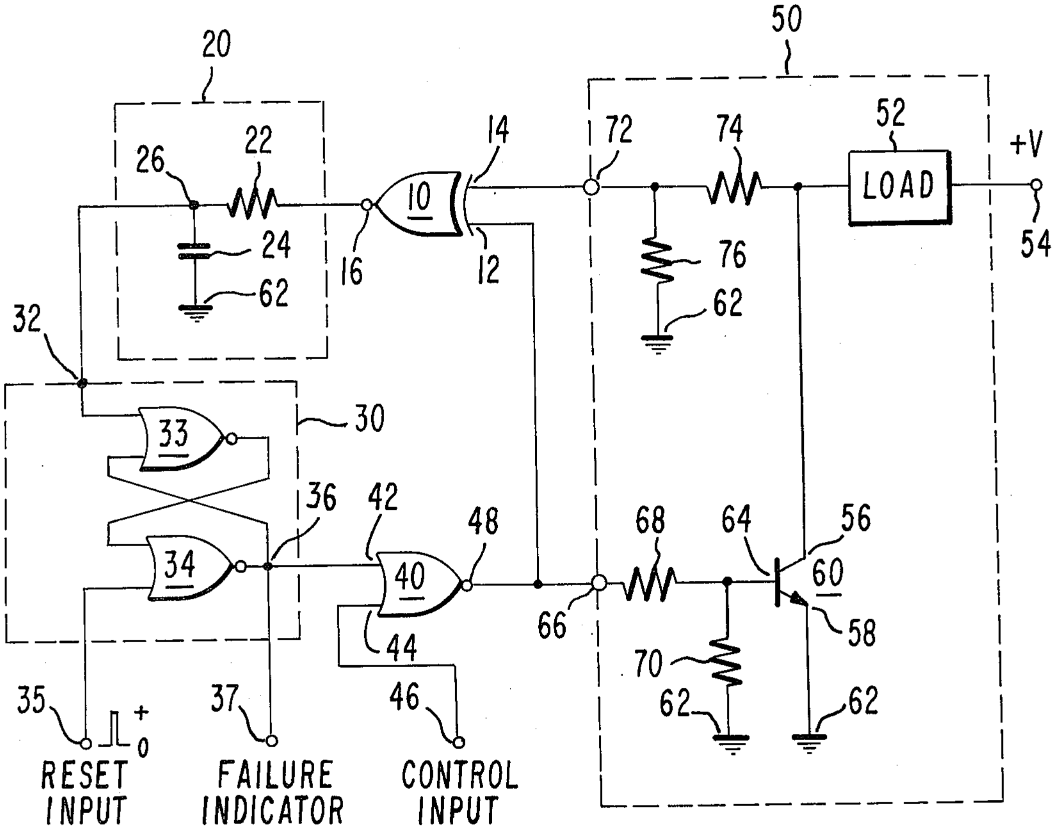
20
26
22
24
62
16
10
14
12
32
33
30
34
36
42
40
48
44
35
37
46
RESET INPUT
FAILURE INDICATOR
CONTROL INPUT
50
72
74
52
LOAD
+V
54
76
62
68
64
56
60
66
58
70
62
62
+
0

FAILURE DETECTING AND INHIBITING CIRCUIT

In many applications it is desired to control the flow of current through a load by means of an electronic switch. In operation, the load, the switch, or both, may fail in any one of several possible failure modes. For example, failure may be evidenced by short circuit or open circuit conditions of either or both of the load or switch. On the other hand, failure may be more subtle, such as a variation of design parameters of the load or switch beyond acceptable limits.

A need exists for a circuit to provide a warning signal to indicate when any one or more of such failure modes has occurred. Such a circuit is particularly needed in safety appliance applications such as electronically switched solenoid actuated braking systems. A need further exists for a circuit to provide protection of the electronic switching element from excessive current flow which may result during a short circuit failure mode of the load device. The present invention is directed to fulfilling these needs.

Embodiments of the present invention include signal equivalence means responsive to first and second input signals for producing an output signal of one value when the input signals are equal valued, the output signal being of another value when the input signals are opposite valued. The output signal is applied to a pulse width discriminator for rejecting signals of less than a minimum duration while passing signals of greater than the minimum duration. Signals passed by the pulse width discriminator are applied to bistable means, initially in a first state, for causing the bistable means to switch to its second state thereby providing a stored indication that the signal equivalence means has produced a selected output signal value of greater than the minimum duration.

A preferred embodiment of the invention is illustrated in the sole FIGURE which includes: a logic equivalence circuit 10; a noise suspension circuit 20; a binary storage circuit 30; a drive inhibit circuit 40; and a switching circuit 50.

Switching circuit 50 comprises a load 52 connected between an operating potential terminal 54 and collector 56 of switching transistor 60, the latter being connected at its emitter 58 to ground reference point 62. Base 64 of transistor 60 is connected to input terminal 66 by resistor 68 and to ground 62 by resistor 70. Output terminal 72 is connected to collector 56 by resistor 74 and to ground 62 by resistor 76.

Switching circuit 50 is a conventional series connected switch and load with provision for monitoring the switch voltage. In normal operation, a positive potential, +V (relative to that of ground 62) is applied to operating potential terminal 54. A positive drive signal applied to input terminal 66 causes a current flow through resistor 68, a portion of which flows into base 64 of transistor 60, turning it on. This clamps collector 56 essentially to the potential of ground 62, causing a load current to flow through load 52 to ground 62. Conversely, when a ground level potential is applied to input terminal 66, base 64 is held at ground potential by the equivalent parallel resistance of resistors 68 and 70, which maintain transistor 60 in a switched off condition so that collector 56 is held substantially at the potential of terminal 54. The voltage divider formed by resistors 74 and 76 monitors the collector-to-emitter voltage of transistor 60 and produces an output signal at output terminal 72 that is a fraction of this voltage. Thus, in normal operation. the output signal at terminal 72 is, logically speaking, the inverse of the input signal applied to terminal 66 under steady state conditions.

The normal input/output signal relationship (inversion) of switching circuit 50 is not met, however, under transient switching conditions. The reason is that known switching circuits exhibit an inherent delay between the time the input signal transition occurs and the time the output signal reaches its final steady-state value. This delay may be relatively short (nanoseconds) for unsaturated logic circuits or it may be quite long (milliseconds) for saturated switches driving reactive loads. Regardless of its actual value, this delay results in an input-output signal relation under transient conditions that differs from that which results under steady-state conditions. Specifically, if the normal relation is one of inversion, the output signal will appear non-inverted during the transient condition and inverted in the steady-state condition. Conversely, if the normal relation is one of non-inversion the output signal will appear inverted during the transient condition and non-inverted in the steady-state condition.

The importance of the transient response of the switching circuit described above is that if the input/output signal relationship is to be used as a measure of whether the circuit is operating normally or has failed, it is necessary to test the relationship during the time that the circuit is (or should be) in its steady-state condition. Before discussing how this is accomplished, it is helpful first to discuss several possible failure modes of switching circuit 50. For convenience, the failure modes are divided into simple failure mode and double failure mode categories.

The single failure mode category includes those cases in which either the switch or the load, but not both, has failed in either a short-circuit or open-circuit mode. Thus, there are four possible single mode failure conditions. The double mode failure category includes those cases in which both the switch and the load have failed, each in either a short circuit or an open circuit condition. There are thus four possible double failure modes. The terms short circuit and open circuit are hereafter used also to designate variations of normal operating parameters of the transistor (current gain) or load (impedance) beyond acceptable limits.

In the present invention, failure is detected by determining whether the input/output signal relation of the switching circuit is normal (inverting) or abnormal (non-inverting or undefined). For example, a failure in the single failure mode category results in output terminal 72 being maintained at the potential of ground terminal 62 or at a fraction of the potential of input terminal 54. Similarly, in the double failure mode category, where load 52 is shorted and transistor 60 is open, or load 52 is open and transistor 60 is shorted or open, output terminal 72 will also assume a constant potential. In all the above cases, the input/output signal relationship of switching circuit 50 will be non-inverting for at least one value of drive signal applied to input terminal 66 and may be detected by performing an EXCLUSIVE NOT (XNOR) comparison of the input and output signals.

In the double failure mode case where both transistor 60 and load 52 fail in a short circuit condition, the signal at output terminal 72 is undefined but may be assumed to be greater or lesser than a threshold value and is thus also detectable by an EXCLUSIVE NOR comparison.

In more detail, logic equivalence circuit 10 (shown in the FIGURE as an EXCLUSIVE NOR gate) has its input terminals 12 and 14 connected to input terminal 66 and output terminal 72, respectively. This circuit produces an output signal at the output terminal 16 of one value (positive) when its input signals are of identical logic states, the output signal being of another value (ground) when its input signals are of opposite logic states. Thus, if switching circuit 50 fails to logically invert signals applied to input terminal 66, logic equivalence circuit 10 will produce a positive output signal for at least one state of the signal applied to input terminal 66.

From the previous discussion, however, switching circuit 50 also fails to invert signals supplied to input terminal 66 during the period of transient switching even when operating normally (no failure). The signal at output terminal 16, thus, gives a false indication of failure during transient switching times and a reliable indication of failure during steady state conditions. The false failure indications (which may be viewed as noise) are eliminated in the present invention by the action of noise suppression circuit 20.

Noise suppression circuit 20 is a form of pulse width discriminator which rejects signals of less than a minimum duration while passing signals of greater than the minimum duration. In the preferred embodiment, it comprises a simple resistor capacitor (RC) low pass filter. Resistor 22 is connected between output terminal 16 of the logic equivalence circuit 10 and output terminal 26 of noise suppression circuit 20. Output terminal 26 is connected by capacitor 24 to ground 62.

In operation, the time constant of the RC filter is chosen to be long relative to the expected pulse width of the noise produced by logic equivalence circuit 10 under transient switching conditions when switching circuit 50 is operating normally. The long time constant effectively integrates (suppresses) the noise, thereby allowing only a true failure signal (any signal which is much longer than the normal switching delay induced noise) to pass to output terminal 26.

The noise free signal at output terminal 26 is connected to set terminal 32 of binary storage circuit 30 for providing a stored indication that failure of switching circuit 50 has occurred. Binary storage circuit 30 is a conventional SET RESET flip-flop comprising a pair of two input NOR gates 33 and 34, the output of each being connected to an input of the other. Set terminal 32 is connected to the other input of NOR gate 33 and reset terminal 35 is connected to the other input terminal of NOR gate 34. Output terminal 36 of NOR gate 34 (which corresponds to the flip flop Q output) is connected to output terminal 37 for providing a "failure" indication output signal.

In operation, a positive pulse is applied to reset terminal 35 which resets Q terminal 36 to the potential of ground 62 (low). If switching circuit 50 fails to invert signals supplied to input terminal 66, logic equivalence circuit 10 will produce a positive output signal. If this signal lasts longer than the time constant of noise suppression circuit 20, the signal is passed to terminal 32 which then produces a one (high) at Q output terminal 36 of binary storage circuit 30. This signal appears at output terminal 37 for providing a stored indication that a true failure has occurred, i.e., other than mere transient switching noise resulting from inherent delay in normal operation of switching circuit 50.

Drive inhibit circuit 40 provides a further feature of the invention by which switching transistor 60 is protected from receiving further drive signals after a failure has occurred. This circuit comprises a two input NOR gate, one input 42 connected to the Q output terminal 36 of bistable circuit 30, the other input 44 being connected to control input terminal 46. Output terminal 48 of NOR gate 40 is connected to input terminal 66 of switching circuit 50 and to input terminal 12 of XNOR gate 10.

In operation, assume that a positive potential +V is applied to operating potential terminal 54 and that a momentary positive reset pulse is applied to reset input terminal 35. If switching circuit 50 has not failed, Q output terminal 36 of bistable circuit 30 will be at a relatively low potential indicating that failure has not occurred as previously described. This low potential, applied to input terminal 42 of NOR gate 40 will prime gate 40 to produce output signals at its output terminal 48 which are the inverse of control signals supplied to control input terminal 46. The signal at output terminal 48 provides the drive current to control transistor 60. Since transistor 60 reinverts signals supplied to its base 64, the input signals supplied to XNOR 10 are complementary under normal steady-state conditions.

If, on the other hand, switching circuit 50 has failed, a positive voltage will be produced at Q output terminal 36 of bistable circuit 30 as previously described. Since this voltage is applied to input terminal 42 of NOR gate 40, output terminal 48 thereof will be held at ground potential for any value of control signal applied to control terminal 46, thus preventing further drive current from being applied to the base of transistor 60. The advantage of inhibiting drive to transistor 60 is that where the load has failed in short circuit or low impedance mode, the drive interrupt may protect the transistor from failing also.

The present invention may be implemented by a number of alternative circuit elements and is also suitable for use with switching circuits having non-inverting as well as inverting characteristics.

By way of example, the present invention may be used with a switching circuit having non-inverting input/output characteristics, by replacing XNOR gate 10 with an EXCLUSIVE OR (XOR) gate. Since an XOR gate operating with non-complementary input signals produces the same output signal as an XNOR gate receiving complementary signals the circuit operation would be as previously described for inverting switch circuit 50 and XNOR gate 10. The necessary requirement for logic equivalence circuit 10 (whether implemented with XNOR or XOR gates and whether the switching circuit has an inverting or non-inverting characteristics) is that it be responsive to two binary valued logic input signals to produce an output signal of one value when the input signals are of identical logic states, the output signal being of another value when the input signals are of opposite logic states.

Noise suppression circuit 20, shown as an RC low pass filter, may be implemented by other suitable pulse width discrimination circuits. For example, it may comprise a two-input AND gate having a delay circuit connected between its input terminals. The delay circuit customarily is implemented by a delay line, a low pass filter or logic elements such as inverters or buffers.

Such pulse width discriminators are well known and any circuit capable of producing an output signal in response to an input signal of greater than a minimum duration may be employed as noise suppression circuit 20 in this invention.

Although bistable storage circuit 30 has been illustrated as a conventional cross coupled NOR gate flip flop, other suitable flip flops having set-reset capability may be employed instead.

A number of suitable alternatives may be substituted for NOR gate 40. For example, this gate may be replaced by OR, AND, NAND, or transmission gates or other suitable switching circuits. The choice of any particular gate depends upon the particular application, i.e., the logic convention adopted, whether the switching circuit is inverting or non-inverting, etc. In general any suitable gate or switch which may be inhibited by the output signal produced by the binary storage circuit may be used in place of NOR gate 40 for inhibiting drive signal to the switching circuit.

Although input 12 of XNOR 10 is shown connected to output terminal 48 of NOR gate 40, this input may, in the alternative, be connected to control input terminal 46. In the example given, if this change were made it would be necessary either to change XNOR gate 10 to an XOR gate or to otherwise provide an additional signal inversion since NOR gate 40 is an inverting gate.

In summary, there are numerous well known forms of circuit elements by which the invention may be realized. The principal characteristics have been described in detail so that the selection of any particular element (OR, NOR, AND, NAND, XOR, XNOR, etc.,) of the combination is a matter of design choice which is dependent upon the switching characteristics (inverting or non-inverting) of the switching circuit that the invention is to be used with.

What is claimed is:

1. In combination:

first means responsive to a first circuit input signal and a priming signal for producing a circuit output signal in accordance with the first circuit input signal when the priming signal is present, the circuit output signal being of a fixed value otherwise;

second means responsive to a second circuit input signal and a further signal for producing an output signal in accordance with the exclusive logical sum thereof;

third means responsive to a selected value of the output signal of the second means of greater than a given duration for producing a trigger signal;

bistable means, initially in a first logic state for producing the priming signal and responsive to the trigger signal for switching to its second logic state for terminating the priming signal; and wherein said further signal is a selected one of the first circuit input and the circuit output signals.

2. The combination recited in claim 1 wherein said second means is an EXCLUSIVE NOR gate.

3. The combination recited in claim 1 wherein said second means is an EXCLUSIVE OR gate.

4. The combination recited in claim 1 wherein said further signal is said circuit output signal.

5. The combination recited in claim 1 wherein said further signal is said first circuit input signal.

6. The combination recited in claim 1 wherein said third means comprises a low pass filter having a time constant of greater than said given duration.

* * * * *